(12) United States Patent
Wang et al.

(10) Patent No.: US 11,121,152 B2
(45) Date of Patent: Sep. 14, 2021

(54) THREE-DIMENSIONAL MEMORY DEVICE AND MANUFACTURING METHOD THEREOF

(71) Applicant: Yangtze Memory Technologies Co., Ltd., Wuhan (CN)

(72) Inventors: Qiguang Wang, Wuhan (CN); Lei Jin, Wuhan (CN); An Zhang, Wuhan (CN); Jianwei Lu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 52 days.

(21) Appl. No.: 16/679,265

(22) Filed: Nov. 10, 2019

(65) Prior Publication Data

US 2021/0098487 A1 Apr. 1, 2021

Related U.S. Application Data

(63) Continuation of application No. PCT/CN2019/108117, filed on Sep. 26, 2019.

(51) Int. Cl.
*H01L 27/11582* (2017.01)
*H01L 21/28* (2006.01)
(Continued)

(52) U.S. Cl.
CPC ...... *H01L 27/11582* (2013.01); *C23C 28/042* (2013.01); *H01L 21/0223* (2013.01); *H01L 21/76802* (2013.01); *H01L 21/76877* (2013.01); *H01L 27/1157* (2013.01); *H01L 29/40117* (2019.08); *H01L 29/4234* (2013.01); *H01L 29/42368* (2013.01)

(58) Field of Classification Search
CPC ........... H01L 27/11582; H01L 27/1157; H01L 29/42368; H01L 29/40117; H01L 21/0223; H01L 21/76877; H01L 21/76802
See application file for complete search history.

(56) References Cited

U.S. PATENT DOCUMENTS

| 9,679,907 | B1 | 6/2017 | Kaneko |
| 2012/0146127 | A1 | 6/2012 | Lee |

(Continued)

FOREIGN PATENT DOCUMENTS

| CN | 102122661 A | 7/2011 |
| CN | 108847413 A | * 11/2018 |

(Continued)

*Primary Examiner* — Joseph C. Nicely
(74) *Attorney, Agent, or Firm* — Winston Hsu

(57) ABSTRACT

A three-dimensional (3D) memory device and a manufacturing method thereof are provided. The method includes the following steps. An alternating dielectric stack is formed on a substrate. An opening is formed penetrating the alternating dielectric stack in a thickness direction of the substrate. A blocking layer is formed on a sidewall of the opening. A trapping layer is formed in the opening, and the trapping layer is formed on the blocking layer. The trapping layer includes a lower portion and an upper portion disposed above the lower portion. A thickness of the upper portion in a horizontal direction is greater than a thickness of the lower portion in the horizontal direction. The thickness distribution of the trapping layer is modified for improving the electrical performance of the 3D memory device.

18 Claims, 10 Drawing Sheets

(51) Int. Cl.
*C23C 28/04* (2006.01)
*H01L 21/02* (2006.01)
*H01L 21/768* (2006.01)
*H01L 27/1157* (2017.01)
*H01L 29/423* (2006.01)

(56) References Cited

U.S. PATENT DOCUMENTS

| | | |
|---|---|---|
| 2014/0284695 A1 | 9/2014 | Won |
| 2016/0118398 A1 | 4/2016 | Yon |
| 2016/0181272 A1 | 6/2016 | Rabkin |
| 2016/0211272 A1* | 7/2016 | Koka ................ H01L 29/40117 |
| 2017/0263620 A1 | 9/2017 | Lee |
| 2017/0271527 A1* | 9/2017 | Higuchi ................ H01L 23/528 |
| 2020/0235113 A1* | 7/2020 | Oh .................... H01L 29/40117 |
| 2021/0005617 A1* | 1/2021 | Kai .................... H01L 27/11524 |

FOREIGN PATENT DOCUMENTS

| | | |
|---|---|---|
| CN | 108847413 A | 11/2018 |
| CN | 109496358 A | 3/2019 |
| CN | 208954987 U | 6/2019 |

* cited by examiner

THREE-DIMENSIONAL MEMORY DEVICE AND MANUFACTURING METHOD THEREOF

CROSS REFERENCE TO RELATED APPLICATIONS

This application is a continuation of International Application No. PCT/CN2019/108117 filed on Sep. 26, 2019, which is incorporated herein by reference in its entirety.

BACKGROUND OF THE INVENTION

1. Field of the Invention

The present disclosure relates to a memory device and a manufacturing method thereof, and more particularly, to a three-dimensional (3D) memory device and a manufacturing method thereof.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. In conventional 3D memory architecture, memory strings are formed in channel holes penetrating a multiple layer stack structure on a semiconductor substrate. An epitaxial structure is formed at the bottom of each channel hole for electrically connecting a channel layer of the memory string and the semiconductor substrate. However, as the amount of the layers in the stack structure increases and each layer in the stack structure becomes thinner for higher storage density, some issues become serious and influence the electrical performance and manufacturing yield of the 3D memory device. Therefore, the structure and/or the manufacturing processes of the 3D memory device have to be modified for improving the electrical performance and/or the manufacturing yield of the 3D memory device.

SUMMARY OF THE INVENTION

A three-dimensional (3D) memory device and a manufacturing method thereof are provided in the present disclosure. A thickness of an upper portion of a trapping layer is greater than a thickness of a lower portion of the trapping layer for improving the electrical performance of the 3D memory device.

According to an embodiment of the present disclosure, a manufacturing method of a 3D memory device is provided. The manufacturing method includes the following steps. An alternating dielectric stack is formed on a substrate. An opening is formed penetrating the alternating dielectric stack in a thickness direction of the substrate. A blocking layer is formed on a sidewall of the opening. A trapping layer is formed in the opening, and the trapping layer is formed on the blocking layer. The trapping layer includes a lower portion and an upper portion disposed above the lower portion. A thickness of the upper portion in a horizontal direction is greater than a thickness of the lower portion in the horizontal direction.

In some embodiments, a ratio of the thickness of the upper portion in the horizontal direction to the thickness of the lower portion in the horizontal direction is less than or equal to 1.5.

In some embodiments, the lower portion of the trapping layer is disposed between the upper portion of the trapping layer and the substrate in the thickness direction of the substrate.

In some embodiments, the horizontal direction is orthogonal to the thickness direction of the substrate.

In some embodiments, a top width of the opening is greater than a bottom width of the opening.

In some embodiments, a thickness of the trapping layer is gradually increased from the lower portion toward the upper portion.

In some embodiments, a forming method of the blocking layer includes the following steps. A base layer is formed on the sidewall of the opening. An oxidation process is performed to the base layer, and the base layer is oxidized by the oxidation process to be the blocking layer.

In some embodiments, the manufacturing method of the 3D memory device further includes the following steps. A tunneling layer is formed in the opening. The tunneling layer is formed on the trapping layer in the opening. A semiconductor layer is formed in the opening. The semiconductor layer is elongated in the thickness direction of the substrate, and the semiconductor layer is surrounded by the tunneling layer, the trapping layer, and the blocking layer in the horizontal direction.

In some embodiments, the manufacturing method of the 3D memory device further includes forming a filling layer in the opening. The filling layer is surrounded by the semiconductor layer, the tunneling layer, the trapping layer, and the blocking layer in the horizontal direction.

In some embodiments, the alternating dielectric stack includes dielectric layers and sacrificial layers alternately stacked in the thickness direction of the substrate, and the manufacturing method of the 3D memory device further includes replacing the sacrificial layers with conductive layers so as to form an alternating conductive/dielectric stack after the step of forming the semiconductor layer.

In some embodiments, a material composition of the lower portion of the trapping layer is different from a material composition of the upper portion of the trapping layer.

In some embodiments, a part of the lower portion of the trapping layer is removed for reducing the thickness of the lower portion of the trapping layer.

According to an embodiment of the present disclosure, a 3D memory device is provided. The 3D memory device includes a substrate, an alternating conductive/dielectric stack, an opening, a blocking layer, and a trapping layer. The alternating conductive/dielectric stack is disposed on the substrate. The opening penetrates the alternating conductive/dielectric stack in a thickness direction of the substrate. The blocking layer is disposed in the opening and disposed on a sidewall of the opening. The trapping layer is disposed in the opening and disposed on the blocking layer. The trapping layer includes a lower portion and an upper portion disposed above the lower portion. A thickness of the upper portion in a horizontal direction is greater than a thickness of the lower portion in the horizontal direction.

In some embodiments, a ratio of the thickness of the upper portion in the horizontal direction to the thickness of the lower portion in the horizontal direction is less than or equal to 1.5.

In some embodiments, the lower portion of the trapping layer is disposed between the upper portion of the trapping layer and the substrate in the thickness direction of the substrate.

In some embodiments, the horizontal direction is orthogonal to the thickness direction of the substrate.

In some embodiments, a top width of the opening is greater than a bottom width of the opening.

In some embodiments, a thickness of the trapping layer is gradually increased from the lower portion toward the upper portion.

In some embodiments, the 3D memory device further includes a semiconductor layer and a tunneling layer. The semiconductor layer is disposed in the opening and elongated in the thickness direction of the substrate. The semiconductor layer is surrounded by the trapping layer in the horizontal direction. The tunneling layer is disposed between the semiconductor layer and the trapping layer.

In some embodiments, a material composition of the lower portion of the trapping layer is different from a material composition of the upper portion of the trapping layer.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2-7 are schematic drawings illustrating a manufacturing method of a 3D memory device according to an embodiment of the present disclosure, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIG. 9 and FIG. 10 are schematic drawings illustrating a manufacturing method of a 3D memory device according to further another embodiment of the present disclosure, wherein FIG. 10 is a schematic drawing in a step subsequent to FIG. 9.

DETAILED DESCRIPTION

Figure 1:
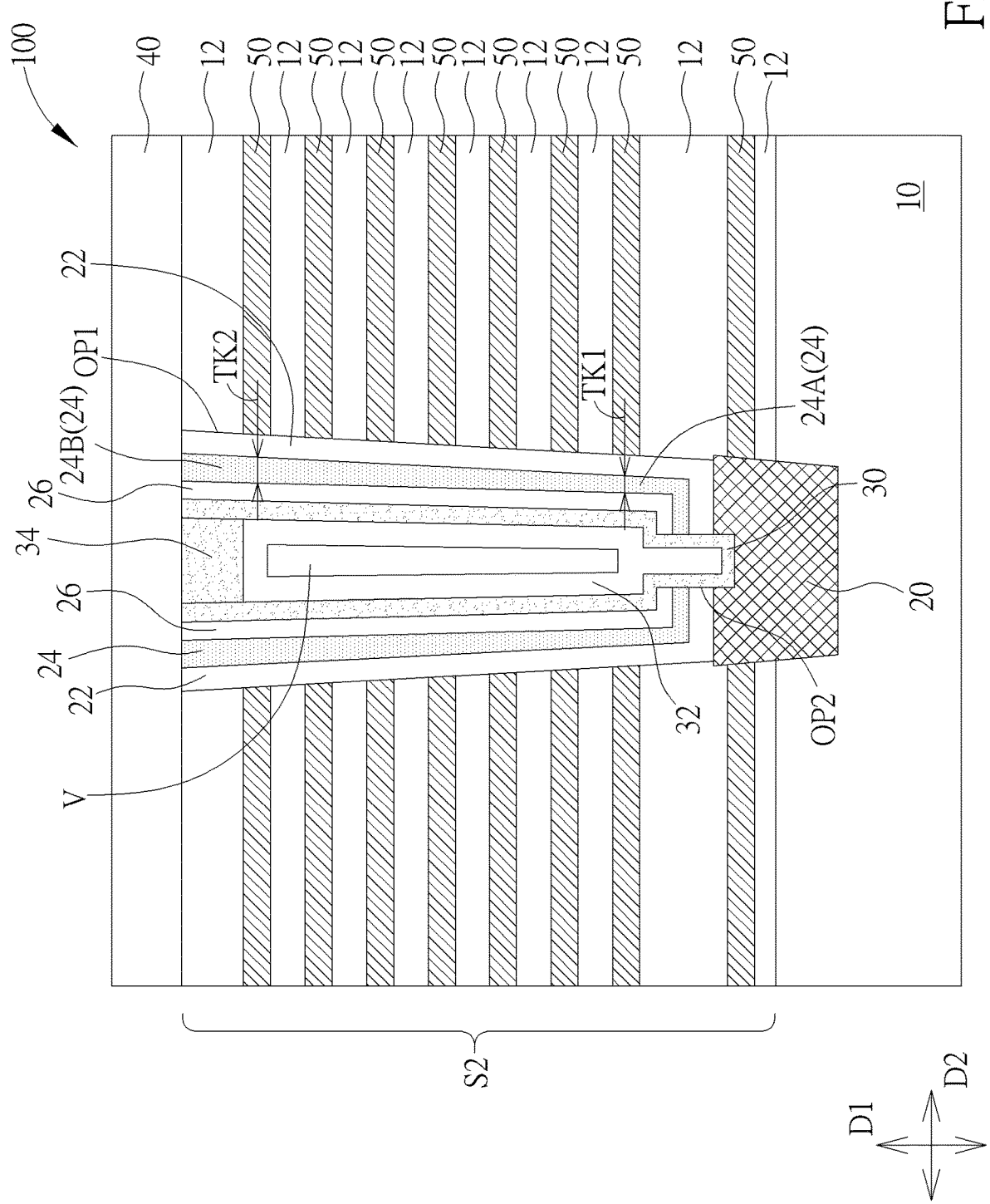
FIG. 1 is a schematic drawing illustrating a three-dimensional (3D) memory device according to an embodiment of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to an object. Such terms are intended to describe any possible layer forming techniques including, but not limited to, thermal growth, sputtering, evaporation, chemical vapor deposition, epitaxial growth, electroplating, and the like.

Please refer to FIG. 1. FIG. 1 is a schematic drawing illustrating a three-dimensional (3D) memory device according to an embodiment of the present disclosure. As shown in FIG. 1, a 3D memory devise 100 is provided in this embodiment. The 3D memory devise 100 includes a substrate 10, an alternating conductive/dielectric stack S2, an opening (such as a first opening OP1 shown in FIG. 1), a blocking layer 22, and a trapping layer 24. The alternating conductive/dielectric stack S2 is disposed on the substrate 10. The first opening OP1 penetrates the alternating conductive/dielectric stack S2 in a thickness direction of the substrate 10 (such as a vertical direction D1 shown in FIG. 1). The blocking layer 22 is disposed in the first opening OP1 and disposed on a sidewall of the first opening OP1. The trapping layer 24 is disposed in the first opening OP1 and disposed on the blocking layer 22. The trapping layer 24 includes a lower portion 24A and an upper portion 24B, and the upper portion 24B of the trapping layer 24 is disposed above the lower portion 24A of the trapping layer 24 in the vertical direction D1. A thickness of the upper portion 24B in a horizontal direction D2 (such as a second thickness TK2 shown in FIG. 1) is greater than a thickness of the lower portion 24A in the horizontal direction D2 (such as a first thickness TK1 shown in FIG. 1). The lower portion 24A of the trapping layer 24 may be disposed between the upper portion 24B of the trapping layer 24 and the substrate 10 in the vertical direction D1. In some embodiments, the blocking layer 22 may be conformally disposed on the inner sidewall of the first opening OP1, and the trapping layer 24 may be disposed on the blocking layer 22 with different thickness distribution for improving the electrical performance of the 3D memory devise 100.

In some embodiments, the horizontal direction D2 may be parallel to a top surface of the substrate 10, and the horizontal direction D2 may be orthogonal to the thickness direction of the substrate 10 (e.g. the vertical direction D1). In some embodiments, the 3D memory devise 100 may further include a tunneling layer 26 and a semiconductor layer 30. The tunneling layer 26 may be disposed in the first opening OP1 and conformally disposed on the trapping layer 24. The semiconductor layer 30 may be disposed in the first opening OP and substantially elongated in the vertical direction D1. The semiconductor layer 30 may be surrounded by the tunneling layer 26, the trapping layer 24, and the blocking layer 22 in the horizontal direction D2. The tunneling layer 26 may be disposed between the semiconductor layer 30 and the trapping layer 24, and the trapping layer 24 may be disposed between the tunneling layer 26 and the blocking layer 22. In some embodiments, the semiconductor layer 30, the tunneling layer 26, the trapping layer 24, and the blocking layer 22 may be regarded as portions of an NAND string penetrating the alternating conductive/dielectric stack S2 in the vertical direction D1, but not limited thereto. In some embodiments, the first opening OP1 may have a cylinder shape elongated in the vertical direction D1, and the semiconductor layer 30, the tunneling layer 26, the trapping layer 24, and the blocking layer 22 may be arranged radially from the center of the first opening OP1 toward the sidewall of the first opening OP1 in this order. Therefore, the first thickness TK1 and the second thickness TK2 described above may be regarded as the thickness of the lower portion 24A sandwiched between the blocking layer 22 and the tunneling layer 26 in the horizontal direction D2 and the thickness of the upper portion 24B sandwiched between the blocking layer 22 and the tunneling layer 26 in the horizontal direction D2.

In some embodiments, the alternating conductive/dielectric stack S2 may include dielectric layers 12 and conductive layers 50 alternately stacked in the vertical direction D1. At least some of the conductive layers 50 in the alternating conductive/dielectric stack S2 may be used as a gate structure in a memory unit, and the memory unit may include a part of the blocking layer 22, a part of the trapping layer 24, a part of the tunneling layer 26, and a part of the semiconductor layer 30 surrounded by the conductive layer 50 in the horizontal direction D2. In other words, the 3D memory devise 100 may include a plurality of the memory units stacked in the vertical direction D1.

In some embodiments, a top width of the first opening OP1 may be greater than a bottom width of the first opening OP1. In other words, the first opening OP1 may have a cylinder shape with a relatively larger upper portion and a relatively smaller lower portion. The volume of the blocking layer 22, the trapping layer 24, the tunneling layer 26, and the semiconductor layer 30 surrounded by the relatively lower conductive layer 50 may be smaller than the volume of the blocking layer 22, the trapping layer 24, the tunneling layer 26, and the semiconductor layer 30 surrounded by the relatively upper conductive layer 50 because of the shape of the first opening OP1, and the electrical properties of the lower memory unit may be different from the electrical properties of the upper memory unit. For example, the initial threshold voltage (Vt) shift of the lower memory units is relatively worse and the margin is relatively narrower, and the programming/erasing variation of the lower memory units is worse than that of the upper memory units accordingly. The retention property (such as charge trapping ability) of the lower memory units may be improved by reducing the thickness of the trapping layer 24 in the lower memory units because relatively less trapped charges are required for the lower memory units. Therefore, the overall electrical performance of the 3D memory devise 100 may be improved by the trapping layer 24 having a relatively thicker upper portion and a relatively thinner lower portion. In some embodiments, the thickness of the trapping layer 24 may be gradually increased from the lower portion 24A toward the upper portion 24B, but the present disclosure is not limited to this. In some embodiments, a ratio of the second thickness TK2 of the upper portion 24B in the horizontal direction D2 to the first thickness TK1 of the lower portion 24A in the horizontal direction D2 may range from 1.25 to 2 because the first thickness TK1 of the lower portion 24A of the trapping layer 24 still has to be kept in a specific range for providing the required function.

In some embodiments, the material composition of the lower portion 24A of the trapping layer 24 may be different from the material composition of the upper portion 24B of the trapping layer 24 for further improving the retention property of the lower memory units. For instance, when the trapping layer 24 include silicon nitride, a ratio of nitrogen to silicon (N/Si) in the lower portion 24A of the trapping layer 24 may be lower than that in the upper portion 24B of the trapping layer 24 by modifying the process of forming the trapping layer 24, but not limited thereto. In some embodiments, process parameters of a furnace process for forming the trapping layer 24 may be modified to form the trapping layer 24 with different N/Si ratios. For example, the time of introducing silane ($SiH_4$) and/or the time of nitrogen ($N_2$) purge may be modified for forming the lower portion 24A with a relatively lower N/Si ratio (about 1.05~1.15, for example) and the upper portion 24B with a relatively higher N/Si ratio (about 1.23, for example), but not limited thereto.

In some embodiments, the 3D memory devise 100 may further include an epitaxial layer 20, a filling layer 32, a conductive structure 34, and a cap layer 40. The epitaxial layer 20 may be disposed at the bottom of the first opening OP1, and a part of the epitaxial layer 20 may be disposed in the substrate 10. In some embodiments, a bottom portion of the blocking layer 22, a bottom portion of the trapping layer 24, and a bottom portion of the tunneling layer 26 may be stacked in the vertical direction D1 and disposed on the epitaxial layer 20. Therefore, the epitaxial layer 20 may be disposed between the blocking layer 22 and the substrate 10 in the vertical direction D1. In some embodiments, a second opening OP2 may penetrate the bottom portion of the blocking layer 22, the bottom portion of the trapping layer 24, and the bottom portion of the tunneling layer 26 in the vertical direction D1 and expose a part of the epitaxial layer 20. The semiconductor layer 30 may be partially disposed in the second opening OP2 for contacting and being directly electrically connected with the epitaxial layer 20, but not limited thereto. In some embodiments, the epitaxial layer 20 may be regarded as a channel structure of a bottom select gate (BSG) transistor in a NAND memory structure, and the semiconductor layer 30 may be electrically connected to a doped well (not shown) in the substrate 10 via the epitaxial layer 20, but not limited thereto. The filling layer 32 may be disposed in the first opening OP1 and surrounded by the semiconductor layer 30 in the horizontal direction D2. One or more air voids V may be disposed in the filling layer 32, but not limited thereto. The conductive structure 34 may be disposed in the first opening OP1 and disposed above the filling layer 32, and the conductive structure 34 may be directly connected with the semiconductor layer 30, but not limited thereto. The cap layer 40 may covers the alternating conductive/dielectric stack S2, the blocking layer 22, the trapping layer 24, the tunneling layer 26, the semiconductor layer 30, and the conductive structure 34 in the vertical direction D1. In some embodiments, a bit line structure (not shown) may penetrate the cap layer 40 for being electrically connected with the NAND string via the conductive structure 34, but not limited thereto.

Figure 2:
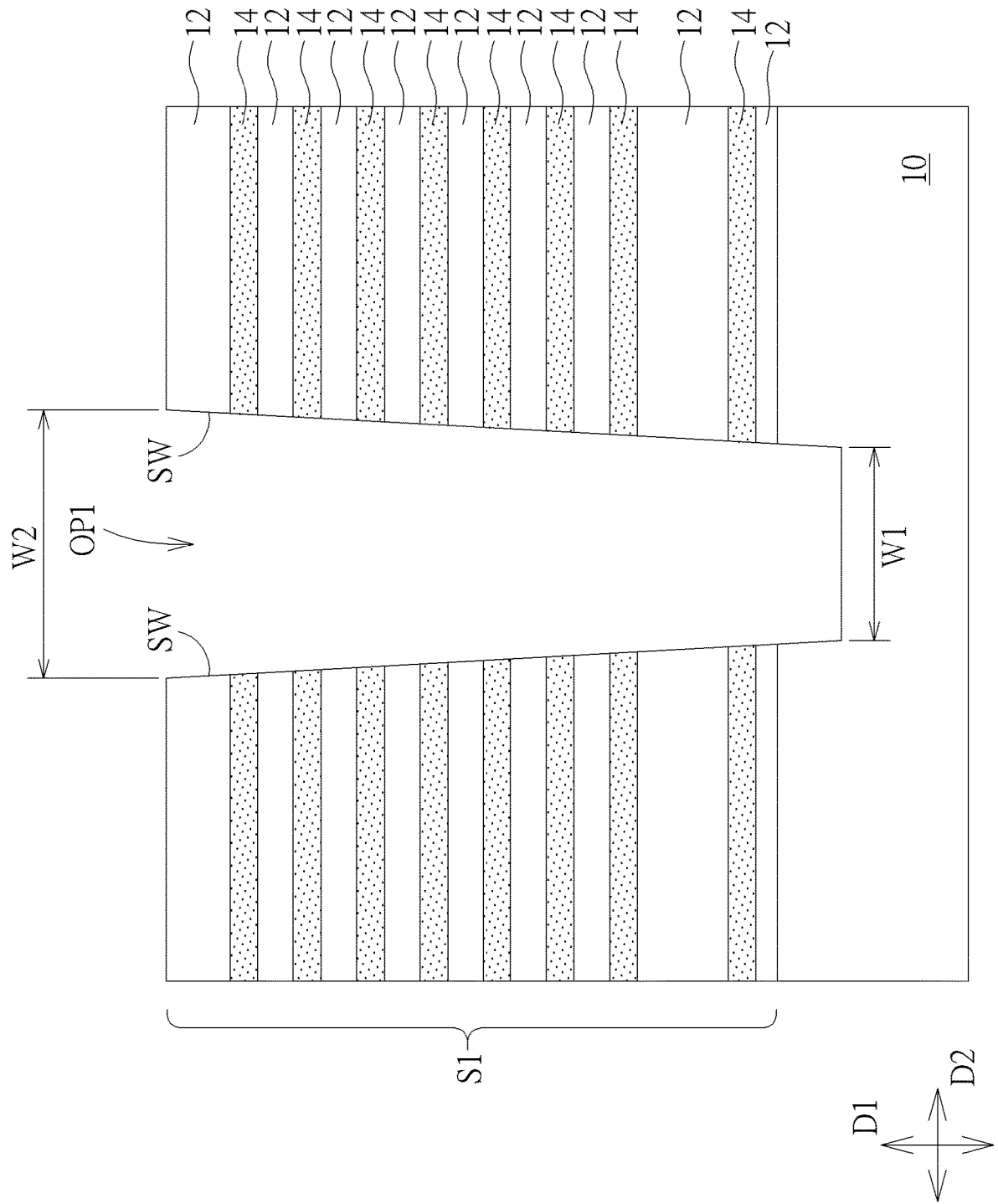
Figure 3:
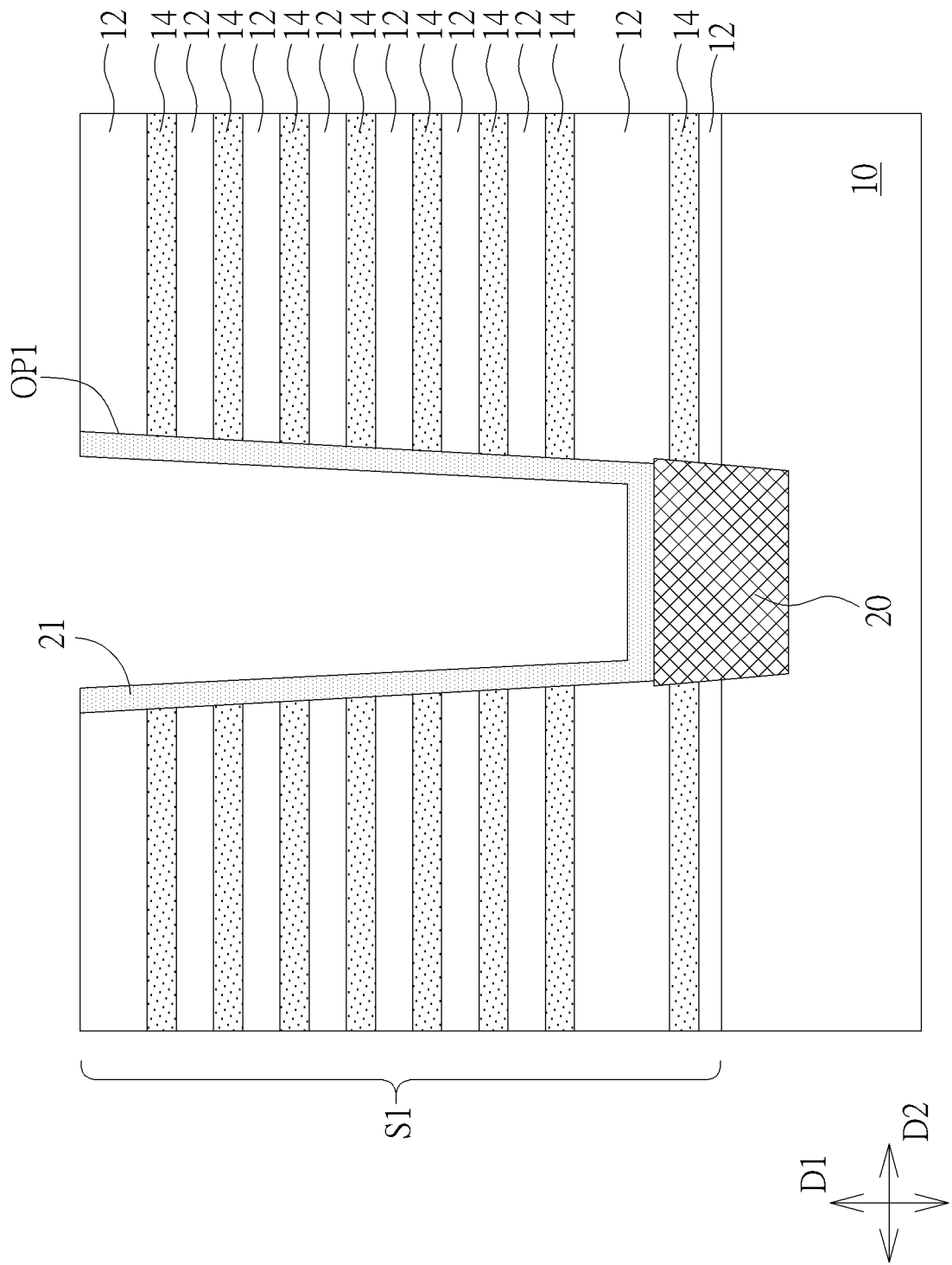
Figure 4:
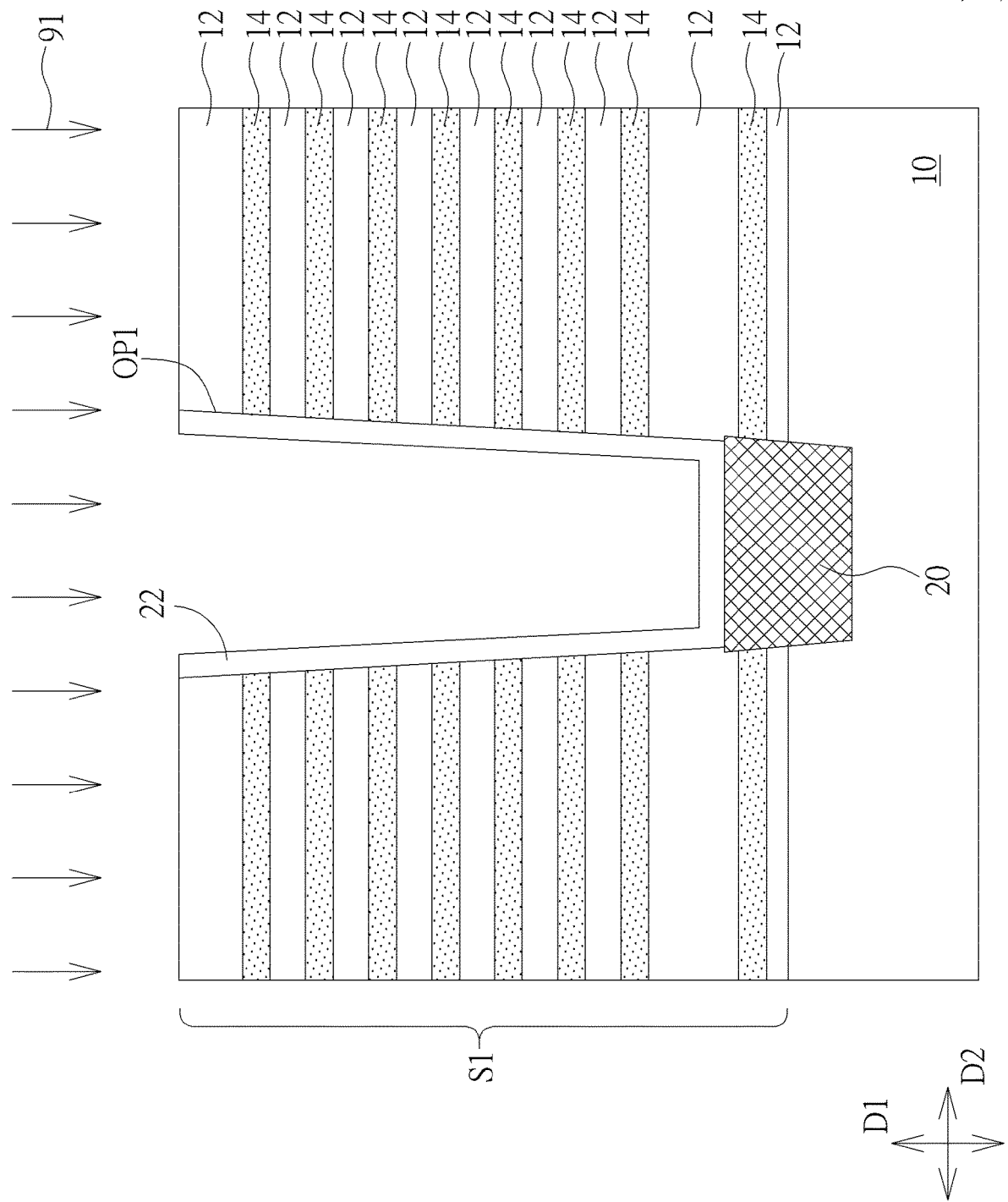
Figure 5:
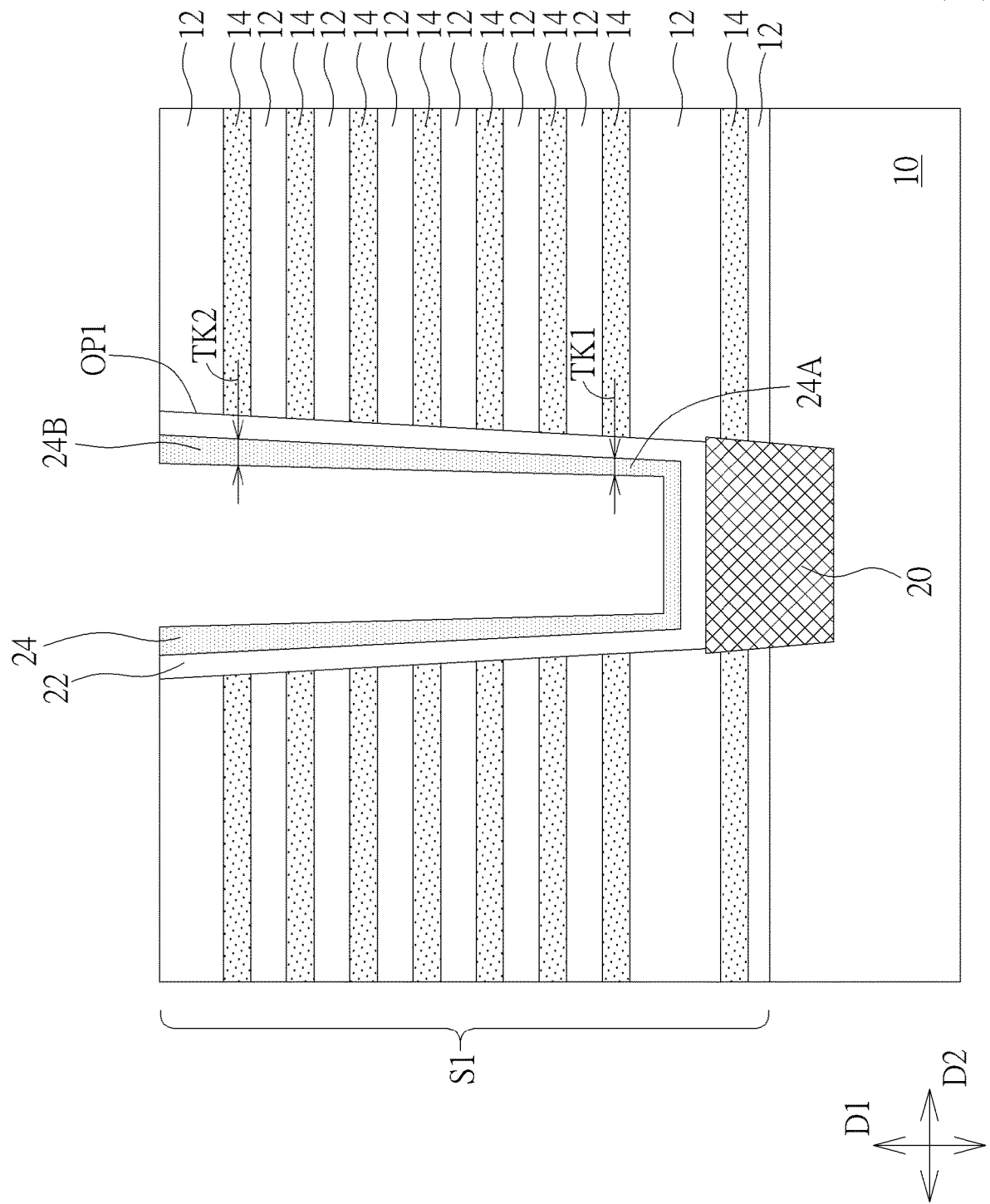
Figure 6:
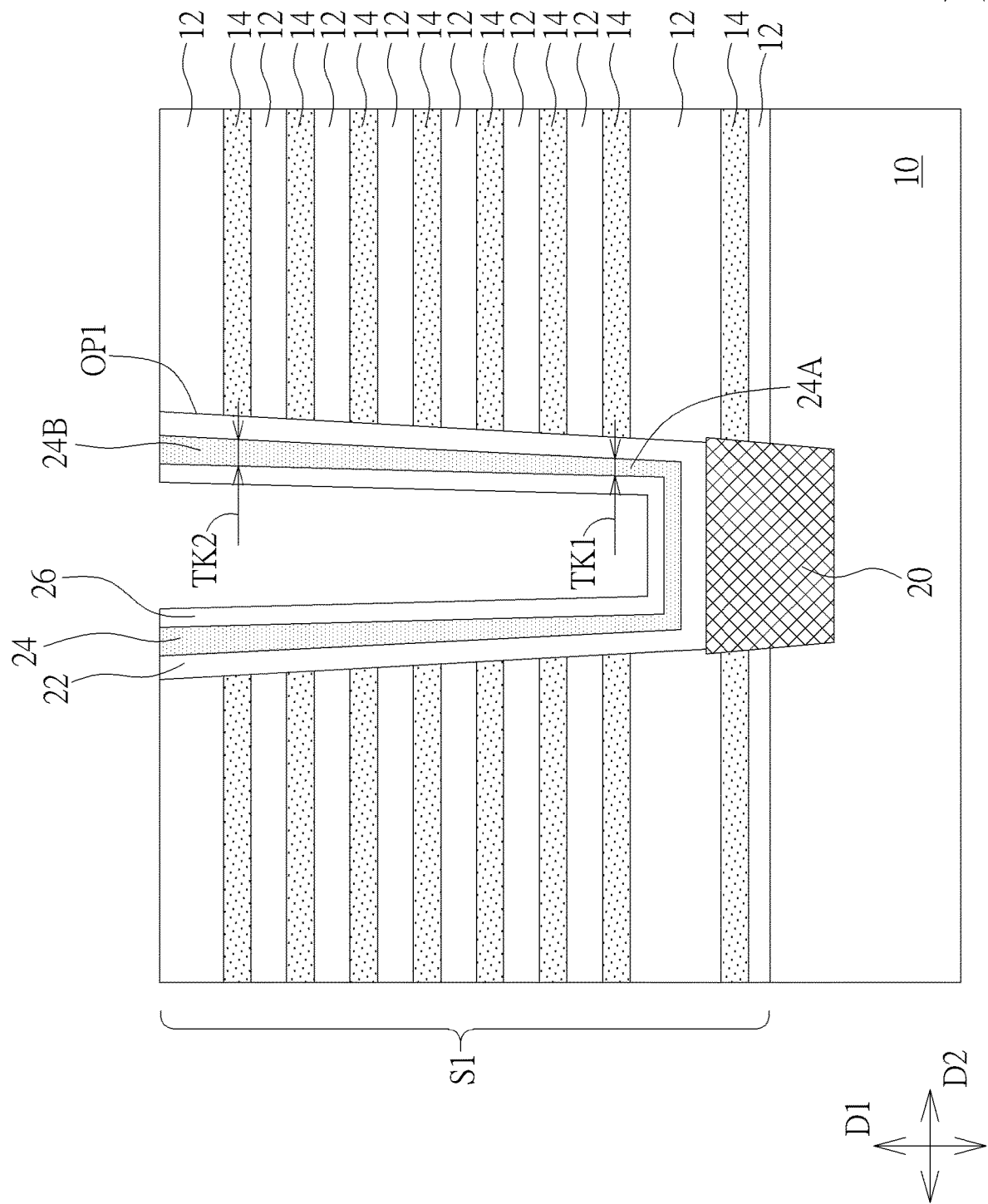
Figure 7:
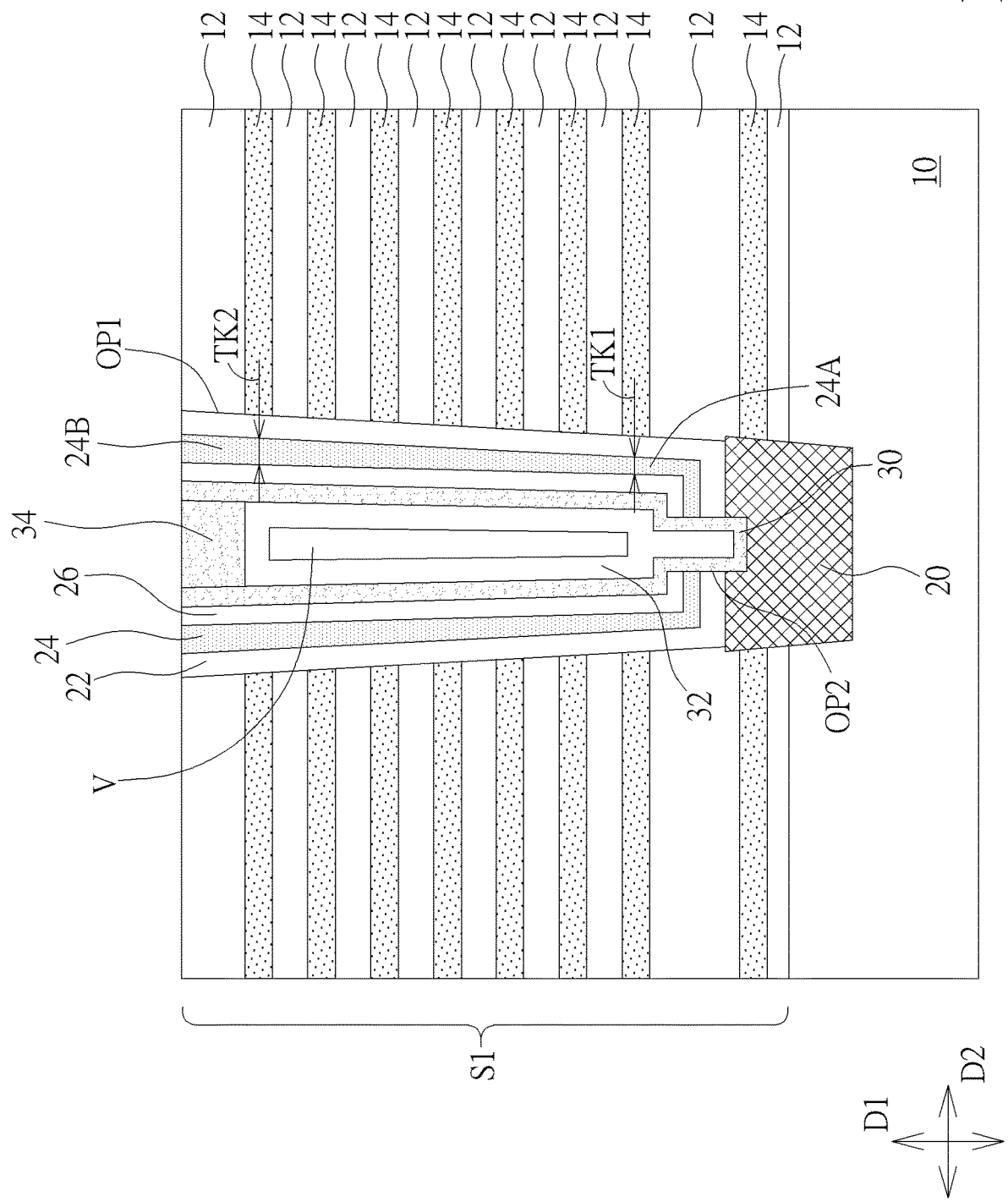

Please refer to FIGS. 2-7 and FIG. 1. FIGS. 2-7 are schematic drawings illustrating a manufacturing method of the 3D memory device in this embodiment. FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 1 may be regarded as a schematic drawing in a step subsequent to FIG. 7. The manufacturing method of the 3D memory device 100 may include but is not limited to the following steps. As shown in FIG. 2, a substrate 10 is provided, and an alternating dielectric stack S1 may be formed on the substrate 10. In some embodiments, the substrate 10 may include silicon (e.g., monocrystalline silicon, polycrystalline silicon), silicon germanium (SiGe), silicon carbide (SiC), gallium nitride (GaN), indium phosphide (InP), gallium arsenide (GaAs), germanium (Ge), silicon on insulator (SOI), germanium on insulator (GOI), or any suitable combination thereof. In some embodiments, the alternating dielectric stack Si may include a plurality of the dielectric layers 12 and a plurality of sacrificial layers 14 alternately stacked in the vertical direction D1, but not limited thereto. The dielectric layers 12 and the sacrificial layers 14 in the alternating dielectric stack S1 may include dielectric materials including, but not limited to, silicon oxide, silicon nitride, silicon oxynitride, or any combination thereof. The material composition of the dielectric layer 12 may be different from the material composition of the sacrificial layer 14 for providing the required etching selectivity in subsequent processes. For instance, each of the dielectric layers 12 may be a silicon oxide layer, and each of the sacrificial layers 14 may be a silicon nitride layer, but not limited thereto. In some embodiments, the total numbers of the dielectric layers 12 and the sacrificial layers 14 in the alternating dielectric stack Si may be 32 or 64, but not limited thereto.

Subsequently, the first opening OP1 is formed penetrating the alternating dielectric stack S1 in the thickness direction of the substrate 10 (i.e. the vertical direction D1). In some embodiments, a shape of the first opening OP1 in a top view of the 3D memory device may be a circle, a rectangle, or other suitable closed shapes. In some embodiments, a plurality of the first openings OP1 may be formed by a photolithographic process, a part of the substrate 10 may be exposed by the first opening OP1, and a part of the substrate 10 may be removed by the step of forming the first opening OP1. Therefore, the bottom surface of the first opening OP1 may be lower than a top surface of the substrate 10 in the vertical direction D1, but not limited thereto. In some embodiments, a top width W2 of the first opening OP1 may be greater than a bottom width W1 of the first opening OP1 because of the etching property of the photolithographic process described above, the total numbers of the dielectric layers 12 and the sacrificial layers 14 in the alternating dielectric stack S1, the thickness of the alternating dielectric stack S1, and/or the high aspect ratio of the first opening OP1. In other words, the sidewall SW of the first opening OP1 may be inclined and an included angle between the sidewall SW of the first opening OP1 and the top surface of the substrate 10 may be not be 90 degrees, but not limited thereto.

As shown in FIGS. 2-4, the epitaxial layer 20 may be formed in the first opening OP1, and the blocking layer 22 may then be formed above the epitaxial layer 20 in the vertical direction D1 and formed on the sidewall SW of the first opening OP1. In some embodiments, the epitaxial layer 20 may be a polysilicon layer formed in the first opening OP1 by a selective epitaxial growth (SEG) process, and the epitaxial layer 20 may grow at the surface of the substrate 10 exposed by the first opening OP1, but not limited thereto. The epitaxial layer 20 may include other suitable epitaxial materials and/or be formed by other suitable processes in some embodiments. Additionally, a forming method of the blocking layer 22 may include forming a base layer 21 on the sidewall SW of the first opening OP1 and performing an oxidation process 91 to the base layer 21, and the base layer 21 may be oxidized by the oxidation process 91 to be the blocking layer 22. The base layer 21 may include a nitride layer (such as a silicon nitride layer) or other suitable dielectric materials, and the base layer 21 may be formed by a deposition process, such as an atomic layer deposition (ALD) process, a chemical vapor deposition (CVD) process, or other suitable film-forming processes. The oxidation process 91 may include an in-situ steam generation (ISSG) process, a thermal oxidation process, or other suitable oxidation approaches. Therefore, the blocking layer 22 may include an oxide layer, but not limited thereto. However, the forming method of the blocking layer 22 in this disclosure is not limited to the method described above, and other suitable approaches and/or other suitable blocking materials may also be used to form the blocking layer 22 in the present disclosure. For instance, in some embodiments, the blocking layer 22 may include an oxide layer formed directly on the epitaxial layer 20 and the sidewall SW of the first opening OP1 by a deposition process, such as an ALD process. In some embodiments, the base layer 21 may include an oxide layer and a nitride layer disposed on the oxide layer, and the nitride layer in the base layer 21 may oxidized by the oxidation process 91 for forming the blocking layer 22.

As shown in FIG. 5, the trapping layer 24 is then formed in the first opening OP1, and the trapping layer 24 is formed on the blocking layer 22. The trapping layer 24 includes the lower portion 24A and the upper portion 24B disposed above the lower portion 24A in the vertical direction D1, and the second thickness TK2 of the upper portion 24B in the horizontal direction D2 may be greater than the first thickness TK1 of the lower portion 24A in the horizontal direction D2. In some embodiments, the trapping layer 24 may be formed by a deposition process, such as an ALD process, a CVD process, or other suitable film-forming processes, and the trapping layer 24 may include one or more films of materials including, but are not limited to, silicon nitride, silicon oxynitride, or any combination thereof. The lower portion 24A of the trapping layer 24 may be located between the upper portion 24B of the trapping layer 24 and the substrate 10 in the vertical direction D1. In some embodiments, the blocking layer 22 may be conformally formed on the sidewall of the first opening OP1, and the trapping layer 24 may be formed on the blocking layer 22 with different thickness distribution by modifying the process parameters of the deposition process for forming the trapping layer 24, but not limited thereto. In some embodiments, the trapping layer 24 with different thickness distribution may also be formed by other suitable approaches. In some embodiments, the thickness of the trapping layer 24 may be gradually increased from the lower portion 24A toward the upper portion 24B especially when the trapping layer 24 with different thickness distribution is formed by modifying the process parameters of the deposition process, but not limited thereto.

As shown in FIG. 6, the tunneling layer 26 may be subsequently formed in the first opening OP1, and the tunneling layer 26 may be formed on the trapping layer 24 in the first opening OP1. In some embodiments, the tunneling layer 26 may be formed by a deposition process, such as an ALD process, a CVD process, or other suitable film-forming processes, and the tunneling layer 26 may include silicon oxide, silicon oxynitride, high dielectric constant (high-k) dielectrics, or any combination thereof.

As shown in FIG. 6 and FIG. 7, the second opening OP2 may be formed penetrating the bottom portion of the blocking layer 22, the bottom portion of the trapping layer 24, and the bottom portion of the tunneling layer 26 in the vertical direction D1 and exposing a part of the epitaxial layer 20. The semiconductor layer 30 may be formed in the first opening OP1 after the step of forming the second opening OP2. The semiconductor layer 30 may be elongated in the vertical direction D1, and the semiconductor layer 30 may be surrounded by the tunneling layer 26, the trapping layer 24, and the blocking layer 22 in the horizontal direction D2. The semiconductor layer 30 may be partly formed on the tunneling layer 26 and partly formed in the second opening OP2 for contacting and being directly electrically connected with the epitaxial layer 20.

The filling layer 32 and the conductive structure 34 may be formed after the step of forming the semiconductor layer 30. The filling layer 32 may be surrounded by the semiconductor layer 30, the tunneling layer 26, the trapping layer 24, and the blocking layer 22 in the horizontal direction D2. In some embodiments, the semiconductor layer 30 may include amorphous silicon, polysilicon, or other suitable semiconductor materials, and the filling layer 32 may include oxide or other suitable insulation materials, but not limited thereto. The conductive structure 34 may be formed on a recess above the filling layer 32, and the conductive structure 34 may include polysilicon or other suitable conductive materials. In some embodiments, the tunneling layer 26 may be used for tunneling electronic charges (electrons or holes). Electrons or holes from the semiconductor layer 30 may tunnel to the trapping layer 24 through the tunneling layer 26, and the trapping layer 24 may be used for storing electronic charges (electrons or holes) for memory operation, but not limited thereto.

As shown in FIG. 7 and FIG. 1, subsequently, the sacrificial layers 14 in the alternating dielectric stack S1 may be replaced with the conductive layers 50 so as to form the alternating conductive/dielectric stack S2. In other words, the conductive layers 50 may be formed after the step of forming the semiconductor layer 30. In some embodiments, the cap layer 40 may be formed covering the alternating dielectric stack S1 before the step of replacing the sacrificial layers 14 with the conductive layers 50, but not limited thereto. The conductive layers 50 may include conductive materials including, but not limited to, tungsten, cobalt, copper, aluminum, doped silicon, polysilicon, silicide, or any combination thereof. The cap layer 40 may include an oxide layer, such as a silicon oxide layer, or other suitable insulation materials. In some embodiments, a gate dielectric layer (not shown) may be formed between the conductive layer 50 and the blocking layer 22 in the horizontal direction D2, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 8:
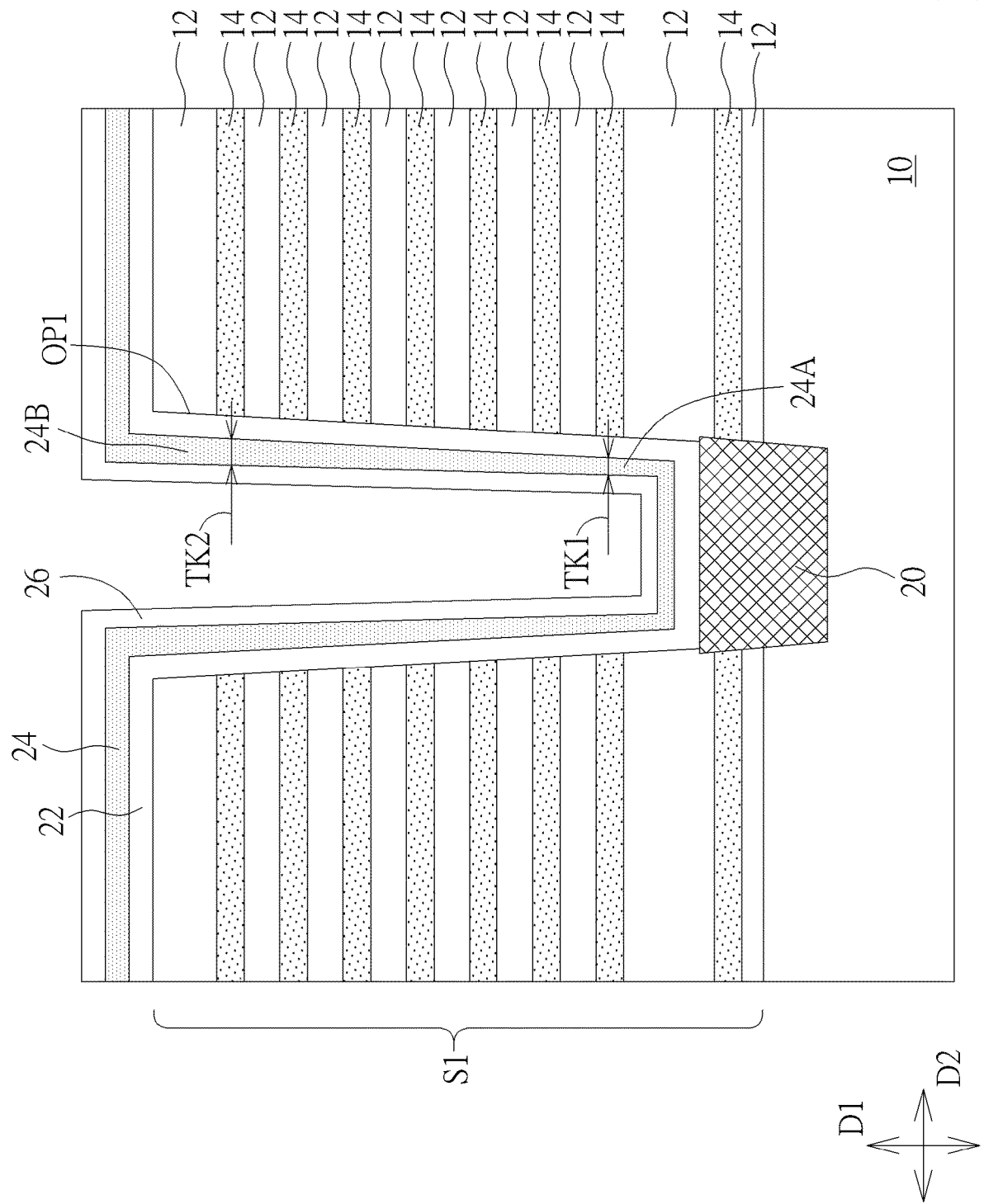
FIG. 8 is a schematic drawing illustrating a manufacturing method of a 3D memory device according to another embodiment of the present disclosure.

Please refer to FIG. 8 and FIGS. 6-7. FIG. 8 is a schematic drawing illustrating a manufacturing method of the 3D memory device according to another embodiment of the present disclosure, and FIG. 6 may be regarded as a schematic drawing in a step subsequent to FIG. 8. As shown in FIG. 8 and FIGS. 6-7, in some embodiments, a part of the blocking layer 22, a part of the trapping layer 24, and a part of the tunneling layer 26 may be formed outside the first opening OP1. A process (such as a chemical mechanical polishing process) may be performed to remove the part of the blocking layer 22, the part of the trapping layer 24, and the part of the tunneling layer 26 outside the first opening OP1 before the step of forming the semiconductor layer 30. In some embodiments, the part of the blocking layer 22 outside the first opening OP1, the part of the trapping layer 24 outside the first opening OP1, and the part of the tunneling layer 26 outside the first opening OP1 may also be removed by different steps according to some considerations. For example, the part of the blocking layer 22 outside the first opening OP1 may be removed before the step of forming the trapping layer 24, and the part of the trapping layer 24 outside the first opening OP1 may be removed before the step of forming the tunneling layer 26, but not limited thereto. However, the influence of the removing steps (such as CMP processes) on the film quality of the trapping layer 24 and/or the blocking layer 22 may be reduced by removing the part of the blocking layer 22, the part of the trapping layer 24, and the part of the tunneling layer 26 outside the first opening OP1 by the same removing step.

Figure 9:
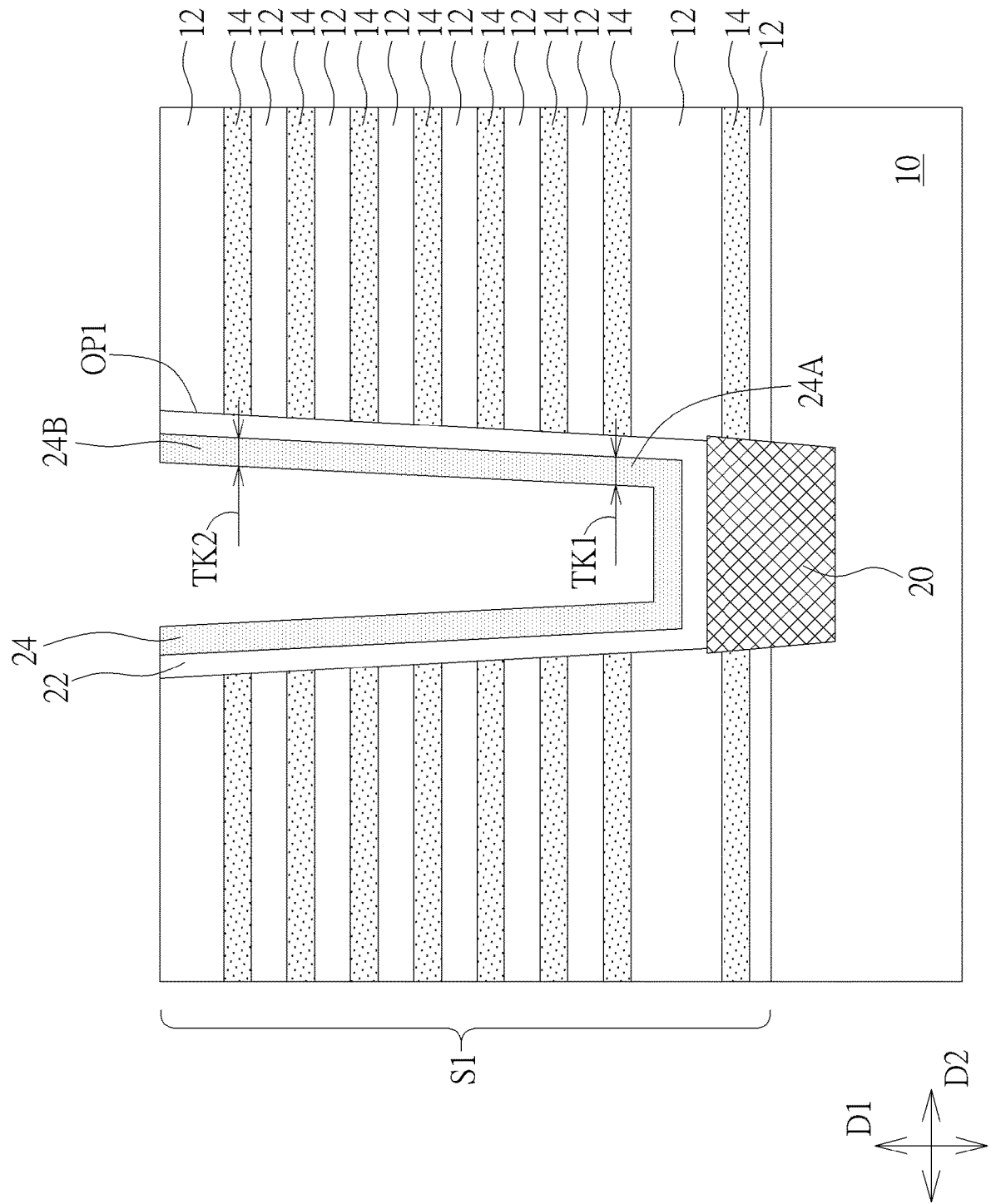
Figure 10:
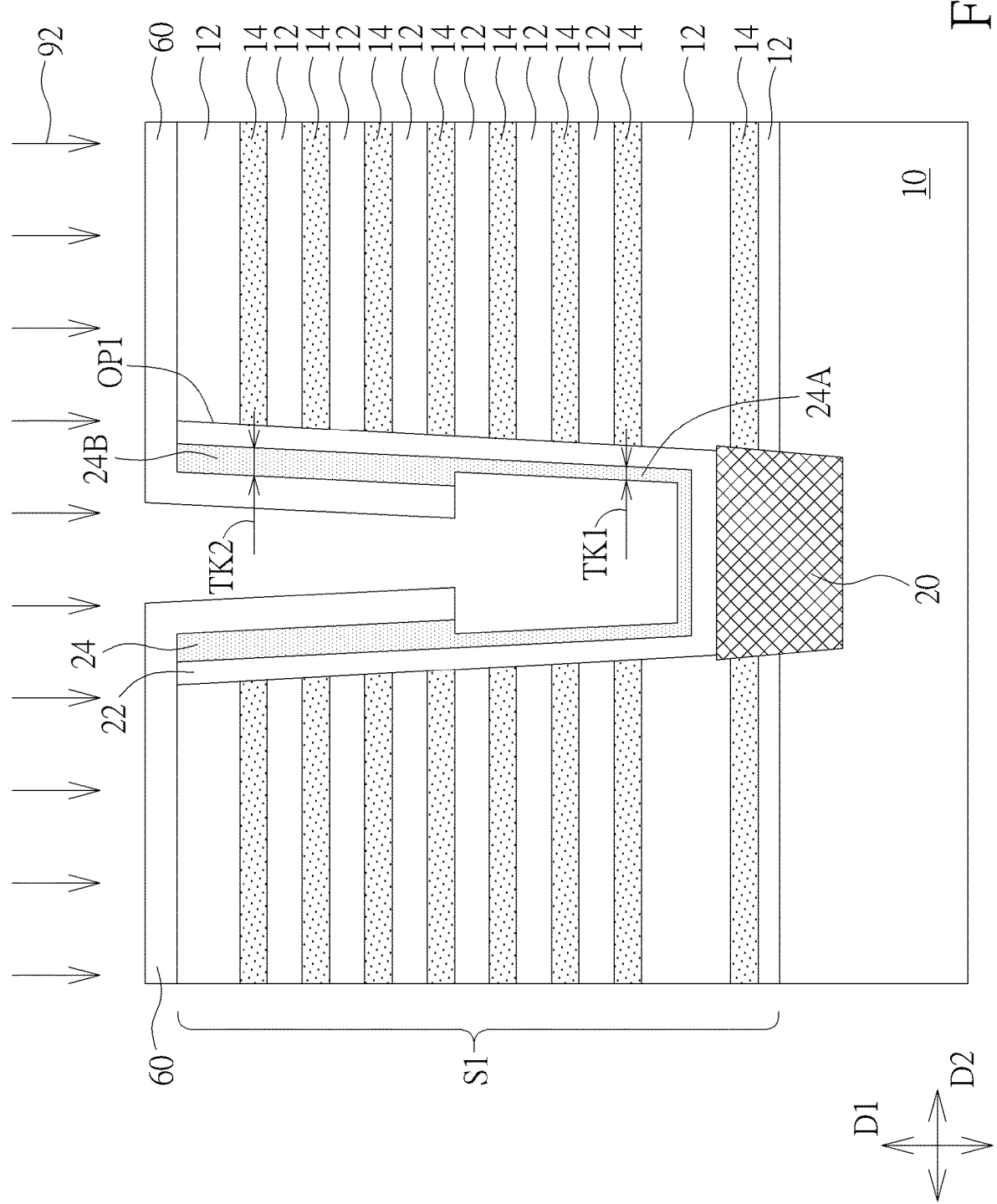

Please refer to FIG. 9 and FIG. 10. FIG. 9 and FIG. 10 are schematic drawings illustrating a manufacturing method of a 3D memory device according to further another embodiment of the present disclosure, and FIG. 10 is a schematic drawing in a step subsequent to FIG. 9. As shown in FIG. 9, the trapping layer 24 may be conformally formed on the blocking layer 22, and the second thickness TK2 of the upper portion 24B in the horizontal direction D2 may be substantially equal to the first thickness TK1 of the lower portion 24A in the horizontal direction D2 as the trapping layer 24 is just formed on the blocking layer 22. As shown in FIG. 9 and FIG. 10, a part of the lower portion 24A of the trapping layer 24 may be removed for reducing the first thickness TK1 of the lower portion 24A of the trapping layer 24. In some embodiments, a mask layer 60 may be formed covering the upper portion 24B of the trapping layer 24, and an etching process 92 may be performed to the lower portion 24A of the trapping layer 24 after the step of forming the patterned 60 for thinning the lower portion 24A of the trapping layer 24. In some embodiments, the etching process 92 may include an isotropic etching process (such as a wet etching process) or other suitable approaches capable of thinning the lower portion 24A of the trapping layer 24. The mask layer 60 may be removed after the etching process 92 and before the step of forming the tunneling layer described above. In some embodiments, the mask layer 60 may be formed covering the upper portion 24B of the trapping layer 24 and the lower portion 24A of the trapping layer 24 before the etching process 92, and the portion of the mask layer 60 formed on the lower portion 24A may be thinner than the portion of the mask layer 60 formed on the upper portion 24B by modifying the step coverage of the mask layer 60. The relatively thinner mask layer 60 formed on the lower portion 24A may be etched and removed by the etching process 92 and the relatively thicker thinner mask layer 60 formed on the upper portion 24B may remain covering the upper portion 24B of the trapping layer 24 during the etching process 92, and a part of the lower portion 24A of the trapping layer 24 may be removed for reducing the first thickness TK1 of the lower portion 24A of the trapping layer 24 after the mask layer 60 formed on the lower portion 24A is removed by the etching process 92.

To summarize the above descriptions, in the 3D memory device and the manufacturing method thereof according to the present disclosure, the thickness of the upper portion of the trapping layer is greater than the thickness of the lower portion of the trapping layer for improving the electrical performance of the 3D memory device. The retention property (such as charge trapping ability) of the lower memory units may be improved by reducing the thickness of the trapping layer in the lower memory units because relatively less trapped charges are required for the lower memory units. Therefore, the overall electrical performance of the 3D memory devise may be improved by the trapping layer having a relatively thicker upper portion and a relatively thinner lower portion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a three-dimensional (3D) memory device, comprising:
   forming an alternating dielectric stack on a substrate,
   forming an opening penetrating the alternating dielectric stack in a thickness direction of the substrate;
   forming a blocking layer on a sidewall of the opening; and
   forming a trapping layer in the opening, wherein the trapping layer is formed on the blocking layer, and the trapping layer comprises:
   a lower portion; and
   an upper portion disposed above the lower portion, wherein a thickness of the upper portion in a horizontal direction is greater than a thickness of the lower portion in the horizontal direction, and a material composition of the lower portion of the trapping layer is different from a material composition of the upper portion of the trapping layer.

2. The manufacturing method of the 3D memory device according to claim 1, wherein a ratio of the thickness of the upper portion in the horizontal direction to the thickness of the lower portion in the horizontal direction ranges from 1.25 to 2.

3. The manufacturing method of the 3D memory device according to claim 1, wherein the lower portion of the trapping layer is disposed between the upper portion of the trapping layer and the substrate in the thickness direction of the substrate.

4. The manufacturing method of the 3D memory device according to claim 1, wherein the horizontal direction is orthogonal to the thickness direction of the substrate.

5. The manufacturing method of the 3D memory device according to claim 1, wherein a top width of the opening is greater than a bottom width of the opening.

6. The manufacturing method of the 3D memory device according to claim 1, wherein a thickness of the trapping layer is gradually increased from the lower portion toward the upper portion.

7. The manufacturing method of the 3D memory device according to claim 1, wherein a forming method of the blocking layer comprises:
   forming a base layer on the sidewall of the opening; and
   performing an oxidation process to the base layer, wherein the base layer is oxidized by the oxidation process to be the blocking layer.

8. The manufacturing method of the 3D memory device according to claim 1, further comprising:
   forming a tunneling layer in the opening, wherein the tunneling layer is formed on the trapping layer in the opening; and
   forming a semiconductor layer in the opening, wherein the semiconductor layer is elongated in the thickness direction of the substrate, and the semiconductor layer is surrounded by the tunneling layer, the trapping layer, and the blocking layer in the horizontal direction.

9. The manufacturing method of the 3D memory device according to claim 8, further comprising:
   forming a filling layer in the opening, wherein the filling layer is surrounded by the semiconductor layer, the tunneling layer, the trapping layer, and the blocking layer in the horizontal direction.

10. The manufacturing method of the 3D memory device according to claim 8, wherein the alternating dielectric stack comprises dielectric layers and sacrificial layers alternately stacked in the thickness direction of the substrate, and the manufacturing method of the 3D memory device further comprises:

replacing the sacrificial layers with conductive layers so as to form an alternating conductive/dielectric stack after the step of forming the semiconductor layer.

11. The manufacturing method of the 3D memory device according to claim 1, wherein a part of the lower portion of the trapping layer is removed for reducing the thickness of the lower portion of the trapping layer.

12. A three-dimensional (3D) memory device, comprising:
a substrate;
an alternating conductive/dielectric stack disposed on the substrate;
an opening penetrating the alternating conductive/dielectric stack in a thickness direction of the substrate;
a blocking layer disposed in the opening and disposed on a sidewall of the opening; and
a trapping layer disposed in the opening and disposed on the blocking layer, wherein the trapping layer comprises:
a lower portion; and
an upper portion disposed above the lower portion, wherein a thickness of the upper portion in a horizontal direction is greater than a thickness of the lower portion in the horizontal direction, and a material composition of the lower portion of the trapping layer is different from a material composition of the upper portion of the trapping layer.

13. The 3D memory device according to claim 12, wherein a ratio of the thickness of the upper portion in the horizontal direction to the thickness of the lower portion in the horizontal direction ranges from 1.25 to 2.

14. The 3D memory device according to claim 12, wherein the lower portion of the trapping layer is disposed between the upper portion of the trapping layer and the substrate in the thickness direction of the substrate.

15. The 3D memory device according to claim 12, wherein the horizontal direction is orthogonal to the thickness direction of the substrate.

16. The 3D memory device according to claim 12, wherein a top width of the opening is greater than a bottom width of the opening.

17. The 3D memory device according to claim 12, wherein a thickness of the trapping layer is gradually increased from the lower portion toward the upper portion.

18. The 3D memory device according to claim 12, further comprising:
a semiconductor layer disposed in the opening and elongated in the thickness direction of the substrate, wherein the semiconductor layer is surrounded by the trapping layer in the horizontal direction; and
a tunneling layer disposed between the semiconductor layer and the trapping layer.

* * * * *